United States Patent [19]

Lin

[11] Patent Number: 5,567,913
[45] Date of Patent: Oct. 22, 1996

[54] ELECTRICAL BOX MOUNTING STAND

[76] Inventor: Chung-I Lin, 3F., No. 3, Alley 33, Lane 422, Ming-Tsu Rd., Lu-Chou Hsiang, Taipei Hsien, Taiwan

[21] Appl. No.: 227,255

[22] Filed: Apr. 14, 1994

[51] Int. Cl.$^6$ .................................................. H02G 3/08
[52] U.S. Cl. ................................. 174/58; 220/3.9
[58] Field of Search .................. 174/58, 53; 220/3.9

[56] References Cited

U.S. PATENT DOCUMENTS

| 4,328,903 | 5/1982 | Baars | 220/3.7 |
| 4,964,525 | 10/1990 | Coffey et al. | 220/3.9 |

FOREIGN PATENT DOCUMENTS 1058517  3/1954  France .

Primary Examiner—Kristine L. Kincaid
Assistant Examiner—Michael J. Cornelison
Attorney, Agent, or Firm—Varndell Legal Group

[57] ABSTRACT

An electrical box mounting stand including a base frame, which has a pivot hole in the middle, a post upstanding from the top wall thereof for pluggable receipt into a respective pin hole on the bottom of an electrical box, a through hole for fastening to the electrical box by a screw, a bottom block extended from the bottom wall thereof at one end at right angles, and a bottom recess at an opposite end, and a leg, which has a pivot at one end turned about the pivot hole, and an elongated leg body extended out of the base frame, the leg body having a series of mounting holes for fastening to a supporting wall to support the electrical box and space it from the supporting wall, wherein the leg can be alternatively set in vertical position stopped against the bottom block of the base frame or a horizontal position received in the bottom recess of the base frame.

1 Claim, 4 Drawing Sheets

5,567,913

ELECTRICAL BOX MOUNTING STAND

BACKGROUND AND SUMMARY OF THE INVENTION

The present invention relates to an electrical box mounting stand for supporting an electrical box on a supporting wall.

A variety of electrical boxes have been disclosed for holding printed circuit boards, electric circuits, switches, etc. These electrical boxes are commonly gathered into two groups, one with stands, the other without stands. An electrical box without stands is directly fastened to the wall, and therefore heat cannot be dissipated from the bottom. An electrical box with stands is spaced from the supporting wall when installed, and therefore heat can be dissipated from the bottom. However, the stands of an electrical box of the later type are not adjustable, therefore the installation area is limited.

One object of the present invention is to provide an electrical box mounting stand for an electrical box which can be adjusted horizontally relative to the electrical box. Another object of the present invention to provide an electrical box mounting stand for an electrical box which can be adjusted vertically relative to the electrical box. Another object of the present invention is to provide an electrical box mounting stand for an electrical box which is suitable for fastening the electrical wall to any supporting wall.

According to the preferred embodiment of the present invention, the electrical box mounting stand comprises a base frame and a leg. The base frame comprises a pivot hole in the middle, a post upstanding from the top wall thereof for pluggable receipt into a respective pin hole on the bottom of an electrical box, a through hole for fastening to the electrical box by a screw, a bottom block extended from the bottom wall thereof at one end at right angles, and a bottom recess at an opposite end. Before the base frame is affixed to the electrical box, it can be adjsuted horizontally by turning the post in the pin hole. The leg comprises a pivot at one end turned about the pivot hole, and an elongated leg body extended out of the base frame. The leg body has a series of mounting holes for fastening to a supporting wall to support the electrical box and space it from the supporting wall. By turning the pivot between the half-round grooves, the leg can be alternatively set in vertical position stopped against the bottom block of the base frame or a horizontal position received in the bottom recess of the base frame.

DETAILED DESCRIPTION OF THE PREFERRED EMBODIMENT

Figure 1:
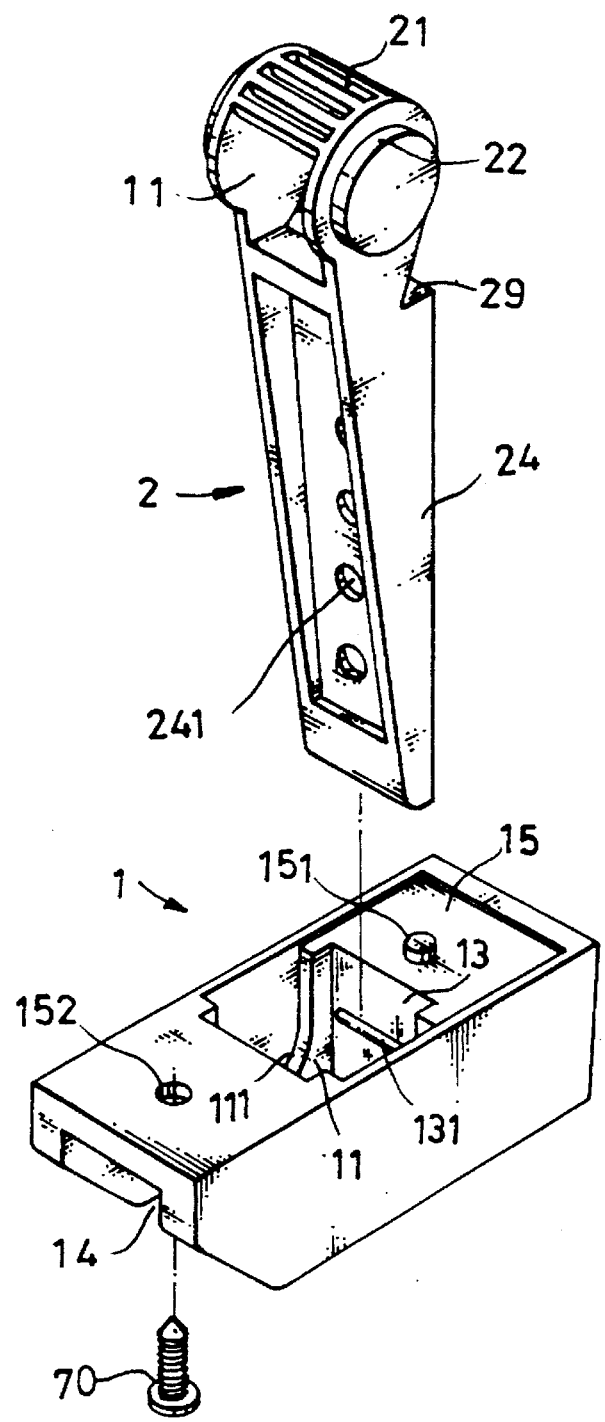
FIG. 1 is an exploded view of an electrical box mounting stand according to the preferred embodiment of the present invention.
Figure 2:
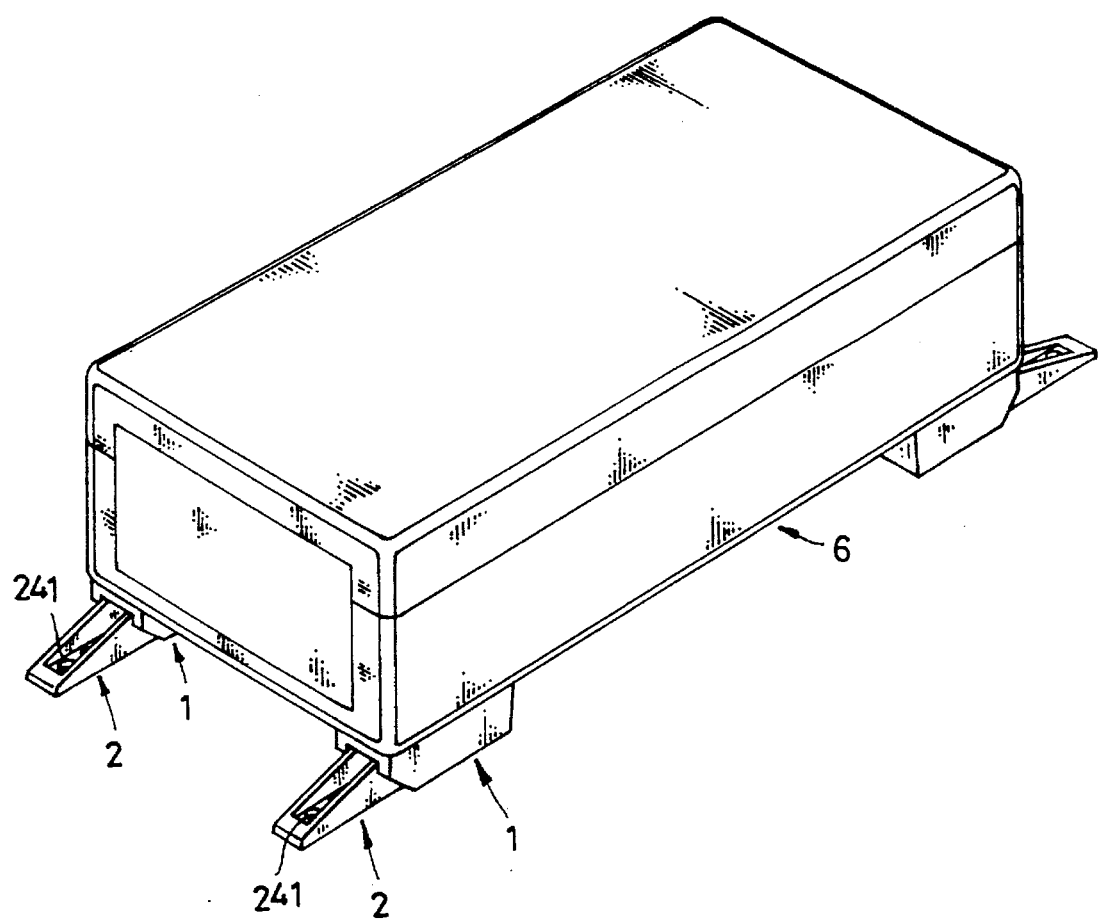
FIG. 2 shows the present invention installed to support an electrical box above a supporting wall.

Referring to the annexed drawings in detail and turning now first to FIGS. 1 and 2, an electrical box mounting stand in accordance with the present invention is generally comprised of a base frame 1 and a leg 2, and fastened to either corner of an electrical box 6 at the bottom for supporting the electrical box 6 on a flat surface.

Referring to FIG. 1 again, the base frame 1 is made of substantially rectangular shape comprising a pivot hole 11 in the middle, two half-round grooves 111 bilaterally disposed within the pivot hole 11, a locating rib 131 transversely raised from one side wall 13 of the pivot hole 11, a longitudinal bottom recess 14 at one end linked to the pivot hole 11, a bottom block 18 (see FIG. 3) extended from the bottom surface thereof at an opposite end at right angles, a circular post 151 upstanding from the top surface 15 thereof at one end for pluggable receipt into a respective pin hole 61 (see FIG. 3) on the bottom surface of the electrical box 6, and a through hole 152 through the top surface 15 thereof at an opposite end and linked to the bottom recess 14. The leg 2 comprises an elongated leg body 24 having a series of holes 241, a pivot 22 at one end of the elongated leg body 24, a transverse notch 29 at one side between the leg body 24 and the pivot 22, and parallel slots 21 spaced around the pivot 22.

Figure 3:
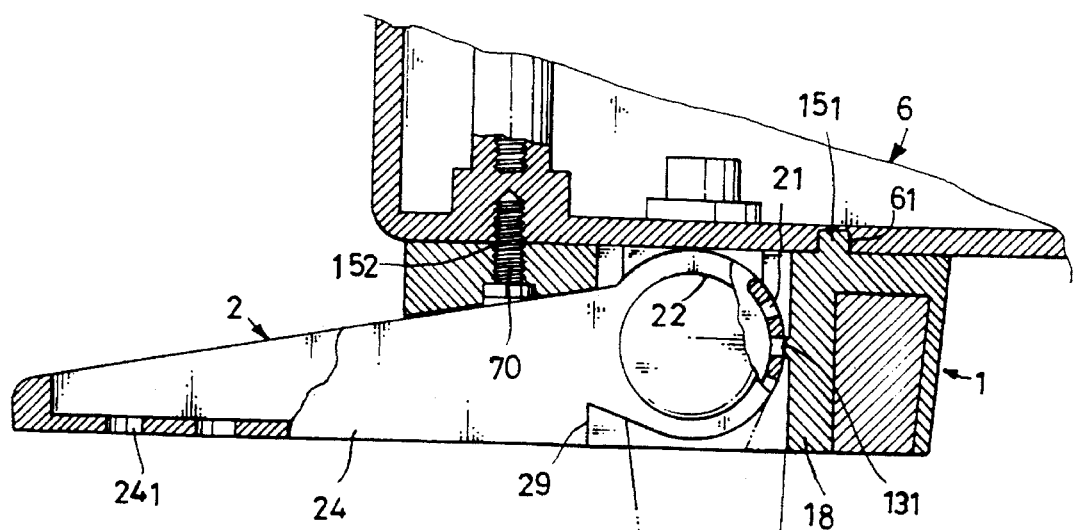
FIG. 3 shows the leg of the electrical box mounting stand turned between 90° angle relative to the base frame thereof.
Figure 4:
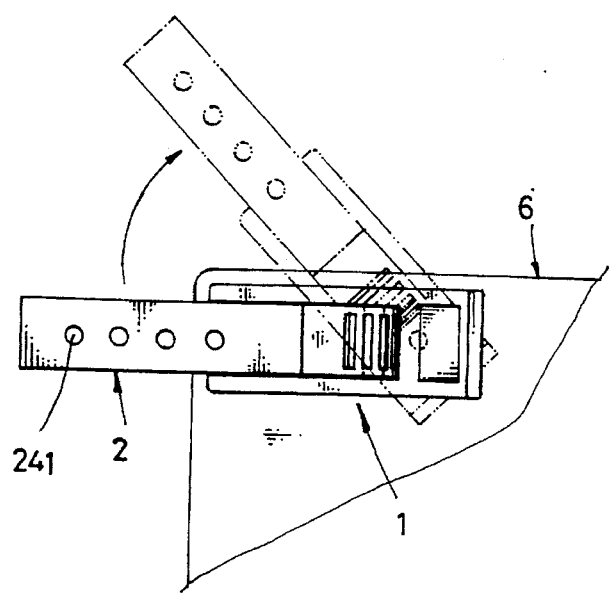
FIG. 4 shows the base frame of the electrical box mounting stand turned about a pin hole on the electrical box to change the position of the leg relative to the electrical box.
Figure 5:
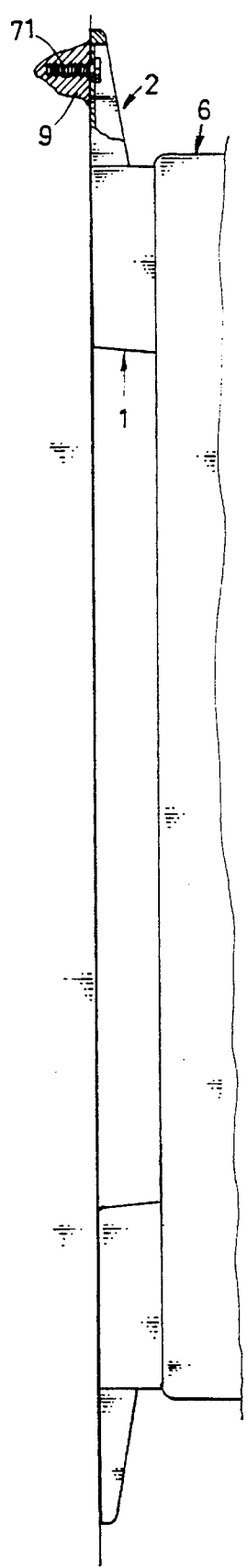
FIG. 5 shows the leg of the electrical box stand affixed to the supporting wall to support the electrical box in position.

Referring to FIGS. 3 and 4, the leg body 24 of the leg 2 is inserted into the pivot hole 11 on the base frame 1 permitting the pivot 22 to be retained between the half-round grooves 111, (see FIG. 1) and therefore the pivot 22 of the leg 2 can be turned between the half-round grooves 111 within 90° angle, that is the leg 2 can able turned to a horizontal position permitting the leg body 24 to be received in the bottom recess 14 (see FIG. 1) of the base frame 1 or a vertical position permitting the transverse notch 29 to be engaged with the bottom edge of the bottom block (see FIG. 3). When adjsuted, the locating rib 131 engages into either slot 21 on the pivot 22. By pulgging the post 151 of the base frame 1 into the respective pin hole 61 on the bottom surface of the electrical box 6, the base frame 1 is attached to the electrical box 6 at the bottom and can be turned on the pin hole 61 to adjust the position of the leg 2 relative to the electrical box 6 (see FIG. 4). When set, a screw 70 is threaded through the through hole 152 on the base frame 1 into a respective screw hole (not shown) on the bottom surface of the electrical box 6 to affix the base frame 1 to the electrical box. When assembled, the electrical box 6 is installed in to the wall 9 by threading screws 71 through the holes 241 on the leg body 24 of the leg 2 into the wall 9.

I claim:

1. An electrical box mounting stand comprising:

an electrical box with a bottom, and a base frame made of a substantially rectangular shape fastened to said bottom of said electrical box; said base frame having a middle, a top surface, a bottom surface, and first and second ends; a pivot hole having a side wall arranged in said middle of said base frame, two half-round grooves bilaterally disposed within said pivot hole, a locating rib transversely raised from said side wall of said pivot hole, a longitudinal bottom recess at said flint end of said base frame and linked to said pivot hole, a bottom block extending at a fight angle from said bottom surface at said second end of said base frame, a circular post upstanding from said top surface at said second end for plugging into a corresponding pin hole on a bottom surface of said electrical box for permitting said base frame to be turned about said pin hole, and a through hole extending through said top surface at said first end for receiving a tie screw threaded into said bottom surface of said electrical box for affixing said base frame to said electrical box, a leg having an elongated body and a transverse pivot at a first end of said elongated body, said pivot received in said pivot hole of said base frame and pivoting between said half-round grooves, said elongated leg body having a second end extending out of said base flame through said pivot hole, said leg further having a side and a transverse notch arranged at said side between said pivot and said elongated leg body, said transverse pivot having a plurality of parallel slots into which said locating rib engages alternatively, said elongated leg body including a series of mounting holes for fastening said electrical box to and spacing said electrical box from a supporting wall, wherein said leg can be alternatively set in a vertical position permitting said transverse notch to be engaged with said bottom block or a horizontal position permitting said elongated body to be received in said bottom recess.

\* \* \* \* \*